(12) United States Patent  
Spence (10) Patent No.: US 6,188,150 B1  
(45) Date of Patent: Feb. 13, 2001

(54) LIGHT WEIGHT HIGH-STIFFNESS STAGE PLATEN

(75) Inventor: Paul A. Spence, Pleasanton, CA (US)

(73) Assignee: EUV, LLC, Santa Clara, CA (US)

( * ) Notice: Under 35 U.S.C. 154(b), the term of this patent shall be extended for 0 days.

(21) Appl. No.: 09/334,702

(22) Filed: Jun. 16, 1999

(51) Int. Cl.[7] ................................................. H02K 41/00
(52) U.S. Cl. ............................... 310/12; 33/1 M; 414/935
(58) Field of Search ..................... 74/471 XY, 479.01; 310/12; 33/1 M; 29/721, 760, 785; 414/935, 936; 108/137, 138

(56) References Cited

U.S. PATENT DOCUMENTS

| | | | |
|---|---|---|---|
| 5,294,854 | * 3/1994 | Trumper | 310/90.5 |
| 5,623,853 | 4/1997 | Novak et al. | 74/490.09 |
| 5,699,621 | 12/1997 | Trumper et al. | 33/1 M |
| 5,828,142 | 10/1998 | Simpson | 310/12 |

* cited by examiner

Primary Examiner—Clayton LaBalle  
Assistant Examiner—Judson H. Jones  
(74) Attorney, Agent, or Firm—Burns, Doane, Swecker & Mathis, L.L.P.

(57) ABSTRACT

An improved light weight, stiff stage platen for photolithography is provided. The high stiffness of the stage platen is exemplified by a relatively high first resonant vibrational mode as determined, for instance, by finite element modal analysis. The stage platen can be employed to support a chuck that is designed to secure a mask or wafer. The stage platen includes a frame that has interior walls that define an interior region and that has exterior walls wherein the outer surfaces of at least two adjacent walls are reflective mirror surfaces; and a matrix of ribs within the interior region that is connected to the interior walls wherein the stage platen exhibits a first vibrational mode at a frequency of greater than about 1000 Hz.

42 Claims, 5 Drawing Sheets

FIG._9

LIGHT WEIGHT HIGH-STIFFNESS STAGE PLATEN

This invention was made with Government support under Contract No. DE-AC04-94AL85000 awarded by the U.S. Department of Energy to Sandia Corporation. The Government has certain rights to the invention.

FIELD OF THE INVENTION

The invention relates to the design of stage platens for use in projection lithography employing soft x-rays and in particular for use in a lithographic system that includes a multi-chamber housing the reticle, optics, e.g. condenser and camera, and wafer. The light weight stage platen has sufficient stiffness so that it can be accurately controlled and maneuvered by lithography positioning devices.

BACKGROUND OF THE INVENTION

Projection lithography is a powerful and essential tool for microelectronics processing and has supplanted proximity printing. "Long" or "soft" x-rays (a.k.a. Extreme UV) (wavelength range of $\lambda=100$ to 200 Å) are now at the forefront of research in efforts to achieve the smaller desired feature sizes. With projection photolithography, a reticle (or mask) is imaged through a reduction-projection lens onto a wafer. Reticles for EUV projection lithography typically comprise a silicon substrate coated with an x-ray reflective material and an optical pattern fabricated from an x-ray absorbing material that is formed on the reflective material. In operation, EUV radiation from the condenser is projected toward the surface of the reticle and radiation is reflected from those areas of the reticle reflective surface which are exposed, i.e., not covered by the x-ray absorbing material. The reflected radiation effectively transcribes the pattern from the reticle to the wafer positioned downstream from the reticle. A scanning exposure device uses simultaneous motion of the reticle and wafer, with each substrate being mounted on a chuck that is attached to an X-Y stage platen, to continuously project a portion of the reticle onto the wafer through a projection optics. Scanning, as opposed to exposure of the entire reticle at once, allows for the projection of reticle patterns that exceed in size that of the image field of the projection lens. Mirrors are mounted along the sides of a stage platen; and interferometer heads that direct laser beams onto the associated mirrors and detect the beam reflection therefrom are employed for position measuring purposes. Movement of the platen stage is accomplished with motorized positioning devices. A stage platen similarly supports the wafer substrate.

Prior art stage platen typically suffer from a significant drawback in that the sensitivity of measurement accuracy of the stage platen position is adversely affected by temperature. The electromagnetic motors which drive the elements of the stage platen relative to one another are a significant heat source adversely affecting the performance of the laser interferometry typically used to determine the actual stage platen position.

Additionally, prior art stage platens suffer from reduced performance due to their relatively high mass which reduces the stage mechanical resonance frequency and thereby lowers the stage platen performance. If the stage platen is made stiffer to compensate, this may add even more mass. Furthermore, higher mass requires more motor power, which presents more potential for heating.

Therefore, there is a significant problem in the prior art of impeded stage platen performance in terms of accuracy and speed caused by the relatively high weight of the stage platen and the heat generated by the stage platen movement. A stage platen with high mass and low stiffness cannot be controlled to the accuracy needed in state-of-the-art photolithography systems. The art is in search of improved stage platen that can be precisely maneuvered and which ultimately result in the enhanced quality of the printed wafers fabricated.

SUMMARY OF THE INVENTION

The invention is directed to an improved light weight, stiff stage platen for photolithography. The high stiffness of the stage platen is exemplified by a relatively high first resonant vibrational mode as determined, for instance, by finite element modal analysis. The stage platen can be employed to support a chuck that is designed to secure a mask or wafer. The inventive stage platen achieves a high degree of stiffness without requiring excessive mass; this permits the platen to be precisely controlled.

Accordingly, in one embodiment, the invention is directed to a stage platen, for supporting a chuck on an upper surface, the stage platen including:

a frame that has interior walls that define an interior region and that has exterior walls wherein the outer surfaces of at least two adjacent exterior walls are reflective mirror surfaces; and a matrix of ribs within the interior region that are connected to the interior walls.

In a preferred embodiment, the stage platen exhibits a first vibrational mode at a frequency of greater than about 1000 Hz.

In another embodiment, the invention is directed to a stage platen assembly that includes:

(a) a stage platen that includes:
  (i) a frame that has interior walls that define an interior region and that has exterior walls wherein the outer surfaces of at least two adjacent exterior walls are reflective mirror surfaces; and
  (ii) a matrix of ribs within the interior region that are connected to the interior walls;
 (b) a chuck having an upper surface adapted to support a substrate wherein the chuck is attached to the matrix of ribs; and
 (c) actuators for moving the stage platen in vertical and horizontal directions wherein the actuators are attached to a lower surface of the stage platen.

In another preferred embodiment, the stage platen assembly exhibits a first vibrational mode at a frequency of greater than about 800 Hz.

DETAILED DESCRIPTION OF THE INVENTION

Figure 1:
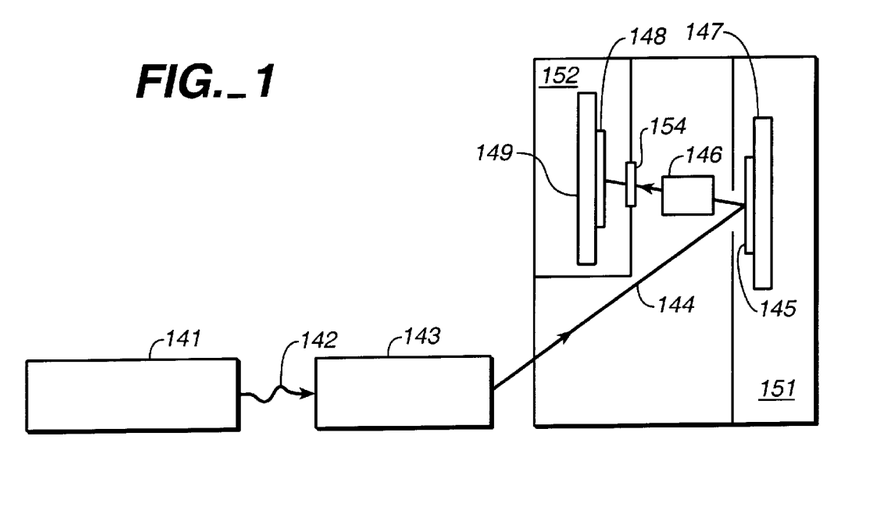
FIG. 1 is a schematic of the main elements of an exemplary photolithography apparatus.

FIG. 1 schematically depicts an exemplary apparatus for EUV lithography that comprises a radiation source 141, such as a synchrotron or a laser plasma source, that emits x-rays 142 into condenser 143 which in turn emits beam 144 that illuminates a portion of reticle or mask 145. The emerging patterned beam is introduced into the imaging optics 146 which projects an image of mask 145, shown mounted on mask stage platen assembly 147, onto wafer 148 which is mounted on wafer stage platen assembly 149. The stage platen assemblies 147 and 149 comprise a stage platen of the present invention and associated components for its maneuver. Precision movement of stage platen assemblies can be implemented by known mechanisms as described, for example, in U.S. Pat. Nos. 5,623,853 and 5,699,621 which are incorporated herein by reference.

In a preferred embodiment, the stage platen assemblies 147 and 149 are housed in separate chambers that are separated from the other elements of the photolithography system located upstream as illustrated in FIG. 1. Stage platen assembly 147 supporting mask 145 is housed in mask chamber or zone 151 which is typically maintained at sub-atmospheric pressure preferably between 1 mTorr to 100 mTorr. Similarly, stage platen assembly 149 supporting wafer 148 is housed in wafer chamber or zone 152 which is preferably maintained at a pressure below about 100 mTorr. Chamber 152 includes a window 154 that is made of a suitable material that transmits EUV. The other elements can be housed in one or more chambers which are preferably maintained in vacuum to minimize attenuation of the x-rays. EUV radiation projected from the mask and translated by a camera travels through an aperture in the wafer chamber. The individual elements that form the EUV lithography device as shown in FIG. 1 can comprise conventional optical devices, e.g., condensers, cameras, and lens, for projection EUV lithography. Preferably the EUVL device employs a condenser that collects soft x-rays for illuminating a ring-field camera.

As illustrated in FIG. 1, the upper surface of mask 145 is facing the upper surface of the wafer 152. In one embodiment, the reticle is inverted so that gravity pulls the wafer from the chuck. A higher clamping force, e.g., electrostatic charge, will be needed to account for the gravitational force. Preferably, the chuck is an electrostatic chuck (ESC) because this design combines the advantages of the more uniform clamping ability of vacuum chucks and the usability in vacuum environments of mechanical chucks. In an ESC, a voltage difference is applied between the substrate (e.g, reticle or wafer) and a metallic electrode or pair of electrodes that is embedded in an insulator block, the substrate and electrode(s) being separated by an interposed dielectric layer. The magnitude of the electrostatic clamping force thus generated depends on the applied voltage, the separation between the wafer and the electrode (s), and the dielectric constant of the interposed layer. As a result of their advantages over other chucking devices, ESCs have gained wide usage in the semiconductor processing industry. ESC devices are known in the art and are described, for example, in U.S. Pat. Nos. 5,221,403, 5,835,333 and 5,835,334 which are incorporated herein by reference.

Figure 2:
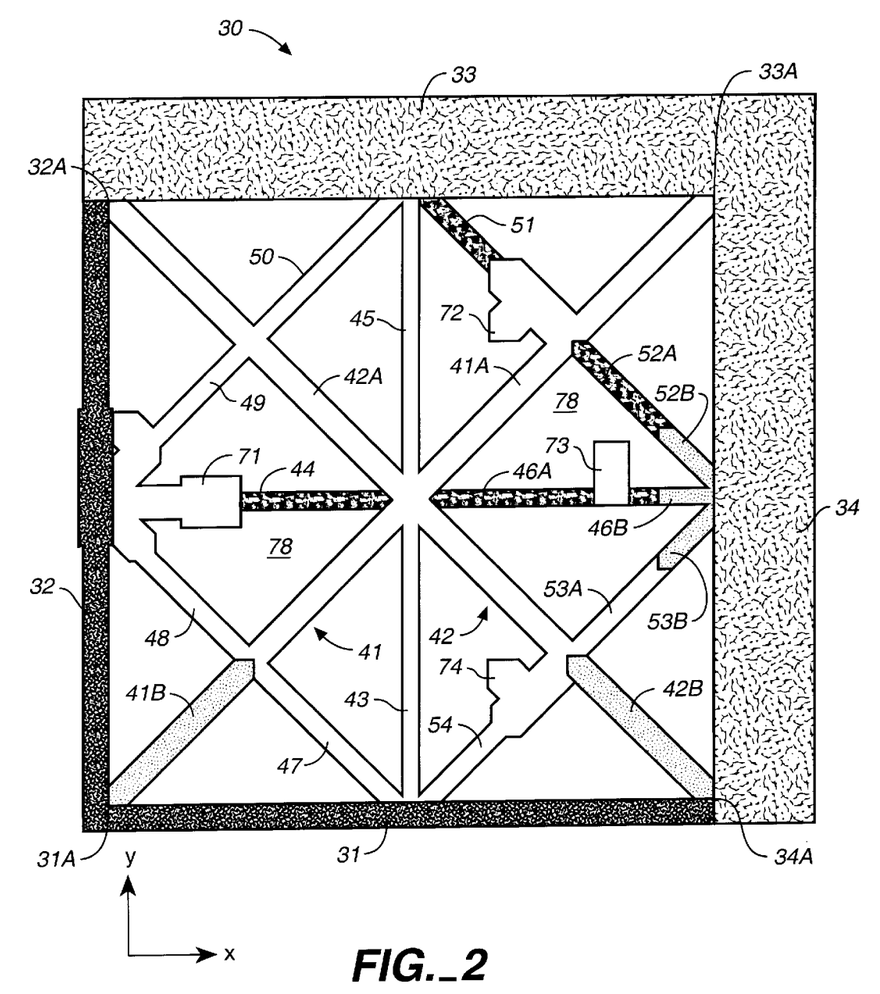
FIG. 2 is a perspective view of the stage platen of FIG. 3.

FIG. 2 illustrates a stage platen 30 to which is secured a chuck 39 that supports a substrate (e.g., reticle or wafer). As described further herein, the stage platen 30 is preferably fabricated from a glass ceramic material and has active accessory components (e.g., actuators and motor magnet array) mounted to it. The stage platen is particularly suited for use with positioning systems that employ magnetic levitation bearings and electromagnetic (e.g., variable reluctance) actuators. Magnetic levitation bearings are described, for example, in U.S. Pat. Nos. 5,699,621, 5,294, 854, and 5,157,296, which are incorporated herein by reference. It is understood, however, that the stage platen of the present invention can be employed in conjunction with other bearing systems including, for example, sliding contact, rolling element, air, hydrostatic, and flexural. Similarly, other actuator devices that provide the accelerating force to move the stage platen can be employed including, for example, motors (linear and rotating), pneumatic, hydraulic, piezoelectric, and other types of electromagnetic systems (e.g., Lorentz). In the embodiment of FIG. 2, for illustrative purposes, horizontal actuators 81 and 83, vertical actuator 82, dual horizontal-vertical actuator 85, and magnet array 84 are attached to the lower portion of stage platen 30.

The glass ceramic material can be polished to be sufficiently reflective so that the exterior sides of the stage platen frame can function as mirrors for interferometric positioning and alignment. By using the mirror in essence as a structural element, the suspended mass of the stage platen is reduced. This is feasible so long as the control forces do not distort the mirror shape. Both reduced mass and higher elastic modes will enable higher control bandwidths which reduce settling times and increase dynamic stiffness.

As further illustrated FIG. 2 which is a plan view of the stage platen without the chuck, the stage platen 30 comprises a frame with a rectangular configuration that is formed by walls or sides 31, 32, 33, and 34. The inner surfaces of the walls define inner corners 31A, 32A, 33A, and 34A. Adjacent walls 33 and 34 are thicker and higher walls than walls 31 and 32. As shown in FIG. 2, the stage platen has a base floor 78 to which the ribs, which are described herein, are connected. The floor 78 is typically about 0.125 in. (0.32 cm) to 0.25 in. (0.64 cm) thick.

The inner surface of the frame is reinforced by a series of support or rib members that enhance the stiffness or rigidity of the stage platen. Main diagonal ribs 41 and 42 are connected to the inner surface of the frame at corners 31A and 33A, and 32A and 34A, respectively. Main rib 41 includes rib segments 41A and 41B and diagonal rib 42 includes rib segments 42A and 42B. In addition, the stage platen is further reinforced by a series of ribs, namely ribs 43, 44, 45, 46A & 46B, 47, 48, 49, 50, 51, 52A & 52B, 53A & 53B and 54. Each of these ribs is connected at one end to one of the main diagonal ribs and at the other end to an inner wall surface and preferably at the midpoint of each inner wall surface. Rib segments 46A and 46B have different dimensions as discussed herein. Similarly, rib segments 52A and 52B, and 53A and 53B, have different dimensions.

As is apparent, the horizontal ribs 44, and 46A and 46B restrain movement of the frame along the x axis; and vertical ribs 43 and 45 restrain movement of the frame along the y axis. The main ribs are supported at opposite corners of the frame and the remaining ribs are diagonal ribs that support adjacent walls of the frame. This series of ribs form a porous matrix or lattice within the interior of the frame structure that increases the stiffness of the stage platen without adding significant weight thereto.

To minimize the weight of the stage platen, the ribs and walls of the stage platen themselves need not comprise solid structures, that is, the components can have perforations, recesses, and the like to reduce their mass. The components that form the stage platen preferably comprise a low expansion material. Suitable materials include, for example, ceramics that have a thermal expansion coefficient of less than about 50 ppb/° C. and density of less than 3000 kg/m$^3$. A preferred material is glass ceramic that is commercially available as ZERODUR from Schott Jenaer Glas, GmbH, Mainz, Germany. Although the stage platen can be fabricated by attaching individual components, a preferred technique is to sculpture the stage platen from a single piece of glass. This affords a unitary structure that imparts greater strength and rigidity to the stage platen.

To secure the chuck, the stage platen includes mounts 71, 72, 73, and 74 that have surfaces to which the chuck can be bolted. The mounts are typically metal structures about 0.375 in (0.95 cm) thick that are attached to the ribs of the stage platen. The mounts can have threads that permit adjustment of the substrate (e.g., wafer) plane during initial stage platen alignment. Each mount will be adjusted to within the desired capture range and subsequently locked into place with a clamp.

While there is no inherent limitation to the dimensions of the stage platen, its overall size is proportional to the size of the reticles or wafers to be employed. The stage platen dimensions provided herein are based on wafer substrates with a preferred diameter of 200 mm. However, wafer diameters of 300 mm or any other size can be accommodated by proportionally modifying the size of the stage platen.

Figure 3:
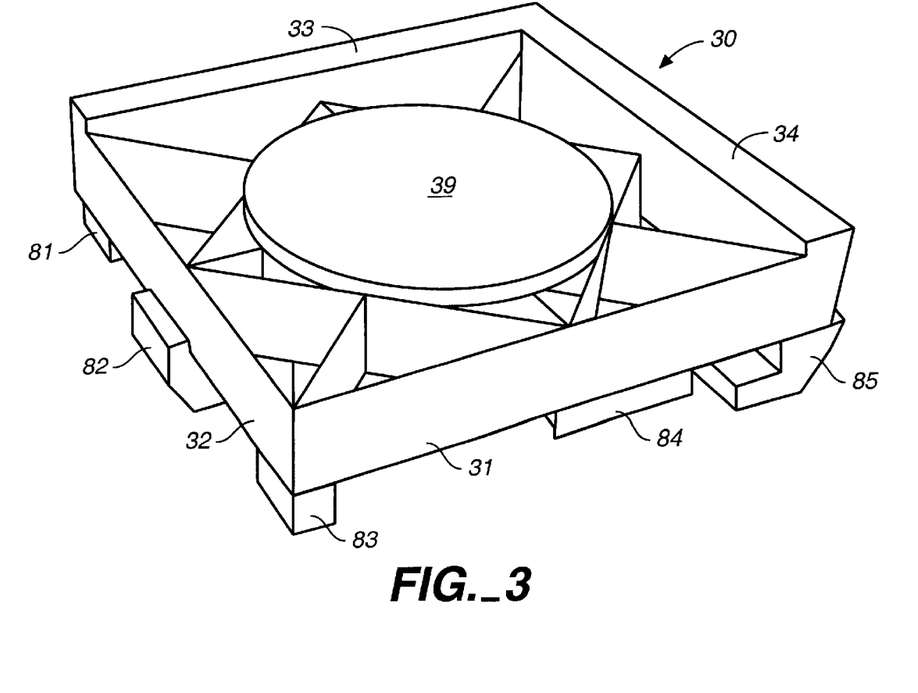
FIGS. 3, and 5–9 are each a plan view of a schematic of a stage platen.

Referring to the stage platen that is shown in FIGS. 2 and 3; Table 1 sets forth preferred dimensions of the various structures of the stage platen. The outer perimeter of the stage platen defines a 12 in. (30.48 cm) by 12 in. (30.48) square. The heights of the ribs are measured from the base floor 78 to which the ribs are connected. The thickness of the floor of the stage platen was 0.125 in. (0.32 cm).

TABLE 1

| Structures | | Height in. | (cm) | Thickness in. | (cm) |
|---|---|---|---|---|---|
| Walls | 31, 32 | 2.0 | (5.1) | 0.25 | (0.64) |
| Walls | 33, 34 | 2.43 | (6.17) | 1.25 | (3.18) |
| Ribs | 41A, 42A | 1.75 | (4.45) | 0.25 | (0.64) |
| Ribs | 41B, 42B | 2.0 | (5.1) | 0.25 | (0.64) |
| Ribs | 43, 44, 45, 46A, 47, 48, 49, 50, 51, 52A, 53A, 54 | 1.75 | (4.45) | 0.125 | (0.32) |
| Ribs | 46B, 52B, 53B | 2.0 | (5.1) | 0.125 | (0.32) |

The light weight stage platen can have any suitable configuration so long as it has the requisite rigidity or stiffness. The frame may have any geometry ranging, for instance, from a circle to a polygon. In addition, the reinforcing ribs are not limited to any particular structure so long as they provide the necessary rigidity without increasing the mass of the stage platen significantly. For ease of design and fabrication, the ribs generally have a regular geometry and preferably, the inner surface of the walls of the frame has a regular geometry. For the stage platen shown in FIGS. 2 and 3, the inner surface defines a square, however, it is understood that the inner surface may have other configurations including, for example, other polygons both regular and irregular and curved configurations, e.g., circle.

In the case where the inner surface defines a polygon, ribs that are attached to the two corners, defined by the inner surface of the frame at substantially opposite sides, are referred as the main or primary ribs. Auxiliary ribs refer to the remaining supporting ribs including, for example, those which are attached to non-corner inner surfaces and those which are attached to the other ribs. Thus, ribs 41 and 42 in FIG. 2 are main ribs. In the case where in the inner surface defines a circle, the ribs that form supports along a diameter are referred to as primary ribs and any other ribs are referred to as auxiliary ribs.

As is apparent, given the large number of variations that the configuration of the inner surface of the frame can have, the above definitions of primary and auxiliary ribs are not exhaustive and do not cover all geometries of the inner surface. However, when applicable, the primary ribs provide a significant degree of rigidity to the stage platen.

The exterior or outer surface of the frame of the stage platen is also not limited to any particular configuration although as described herein preferably at least two surfaces of the exterior frame are substantially planer that function as mirrors. These mirrors reflect radiation (e.g, laser beams) directed from interferometers. The detection of the radiation reflection is employed to position the stage platen. The use of interferometers for alignment and positioned of stage platens is described, for example, in U.S. Pat. Nos. 5,479,257 and 5,530,257, which are incorporated herein by reference. Referring to the stage platen of FIG. 2, preferably the outer surfaces of at least two adjacent walls that are orthogonal to each other, such as walls 33 and 34, are polished to create reflective surfaces that function as mirrors. Indeed, the outer surfaces of all four walls of the rectangular structure of FIG. 2 can be so polished.

For the preferred embodiment, based on the criterion that the stage platen will support a chuck for a wafer that is 200 mm in diameter, it was estimated that the stage platen without the accessory components should have a mass of preferably no more than about 10 lb (4.5 kg) and preferably between about 5 lb (2.3 kg) to 8 lb (3.6 kg). With the addition of the magnet array, actuators, chuck mounts, and chuck to the stage platen, the total mass preferably should be no more than about 25 lb (11.3 kg) and preferably between about 18 lb (8.2 kg) and 23 lb (10.4 kg).

Finite element modal analysis was employed to determine which stage platen designs would demonstrate sufficient stiffness for use in EUV photolithography. The stiffness of the stage platen can be gauged by calculating the frequency of its first mode of vibration. Preferably, the frequency will be at least about 1000 Hz for the stage platen without the accessory components attached. It is anticipated that platen stages exhibiting first mode vibrations at this frequency range will still exhibit sufficient rigidity for precise movement control when the accessories are attached thereto. Specifically, the frequency of the stage platen loaded with the magnet array, actuators, and chuck should exhibit a first mode vibration frequency of least about 800 Hz.

Natural frequency analyses and mode shape extraction were performed for different stage platen configurations using the ABAQUS finite element analysis software from Hibbitt, Karlsson, and Jorensen, Inc., Pawtucket, R.I. For this program, three physical properties of the glass ceramic material used for the stage platen were required, namely the density, elastic modulus, and Poisson's ratio. For stage platens made from ZERODUR, these values were 2530 kg/m$^3$, 90.3 GPa, and 0.24 respectively. Employing the dimensions of the stage platen set forth in Table 1, the natural frequency analysis indicated that the stage platen exhibited a first mode vibration frequency greater than 1000 Hz.

Initial modal analyses of stage platens having generally rectangular configurations similar to the stage platen illustrated in FIGS. 2 and 3 revealed that maintaining sufficient stiffness along the diagonal directions was important. The diagonal ribs, which support adjacent walls, are important in affording substantial stiffness to the stage platen. A preferred method of imparting sufficient stiffness and low mass to the stage platen is to increase the number of diagonal ribs and minimize the ribs in the horizontal and vertical directions.

Figure 4A:
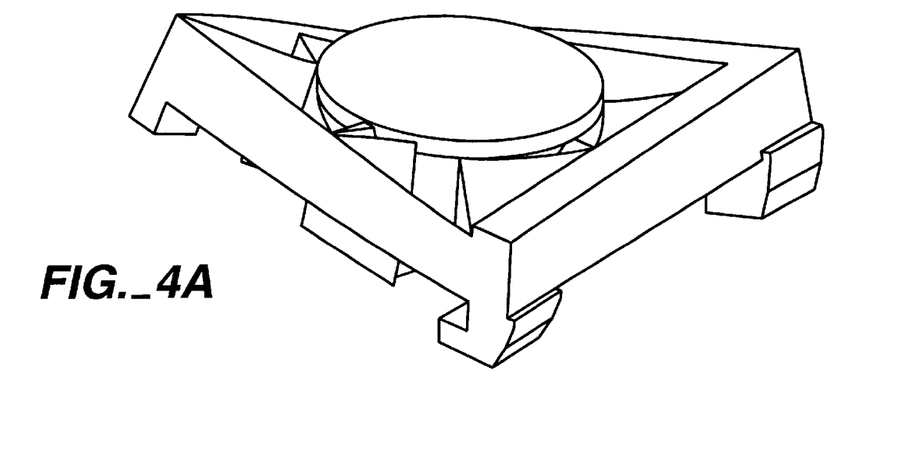
FIGS. 4A, 4B, and 4C illustrate the first, second, and third mode shapes, respectively, for the stage platen of FIGS. 2 and 3.
Figure 4B:
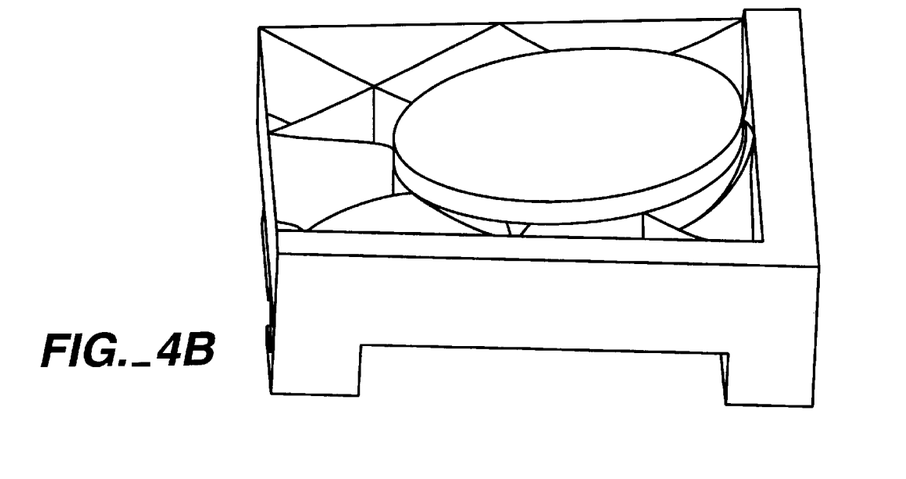
Figure 4C:
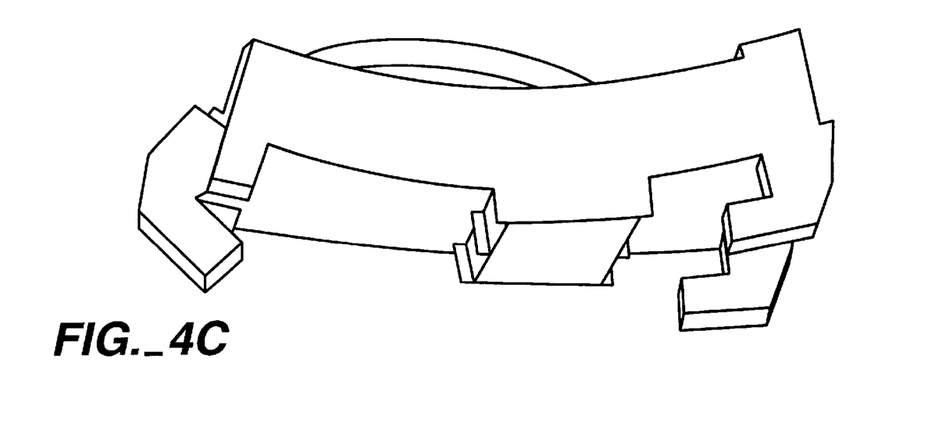

Following the preliminary analysis to attain the stage platen as illustrated in FIGS. 2 and 3 and as further defined with the dimensions set forth in table 1, a similar modal analysis was conducted for the same stage platen design but with the magnet array, actuators, and chuck attached thereto. FIGS. 4A, 4B, and 4C show the first three mode shapes from the finite element model for the fully loaded stage platen with the accessories. The mass of the glass stage platen alone is approximately 8 lb (3.6 kg) and the mass of the stage platen with the attached accessories is 21.9 lb (9.9 kg).

The first mode shape is diagonal bending as shown in FIG. 4A which occurs at 800 Hz. The second mode, which occurs at 1038 Hz, is a wobbling of the chuck and deformation of the platen ribs to which it is attached as shown in FIG. 4B. The third mode is the second platen bending mode, which occurs at 1115 Hz, as shown in FIG. 4C. As is apparent, this design demonstrates the requisite stiffness for use in EUV photolithography.

Modifications to the stage platen of FIGS. 2 and 3 were also evaluated for effectiveness in affording other suitable stage platens. In one variation, the thickness of the two main ribs 41 and 42 was increased from 0.25 in (0.64 cm) to 0.375 in (0.95 cm). This results in a weight increase of 0.6 lb (0.27 kg) for the fully loaded stage platen; and finite element modal analysis showed that the first and second modes of vibrations occur at 825 Hz (a 25 Hz increase) and 1089 Hz (a 51 Hz increase), respectively. In another variation, the overall stage platen height was scaled by 1.25 (e.g., the 2.0 in (5.1 cm) ribs increased to 2.5 in (6.4 cm). The thickness of the two main ribs 41 and 42 remained at the same 0.25 in (0.64 cm). This results in a weight increase of 4.9 lb (2.2 kg) for the fully loaded stage platen; and finite element modal analysis showed that the first and second modes of vibrations occur at 881 Hz (an 81 Hz increase) and at 1929 Hz (a 109 Hz decrease), respectively. As is apparent, both designs improved stiffness (i.e., increase in the vibrational frequency of the first mode) but with an increase in weight.

Figure 5:
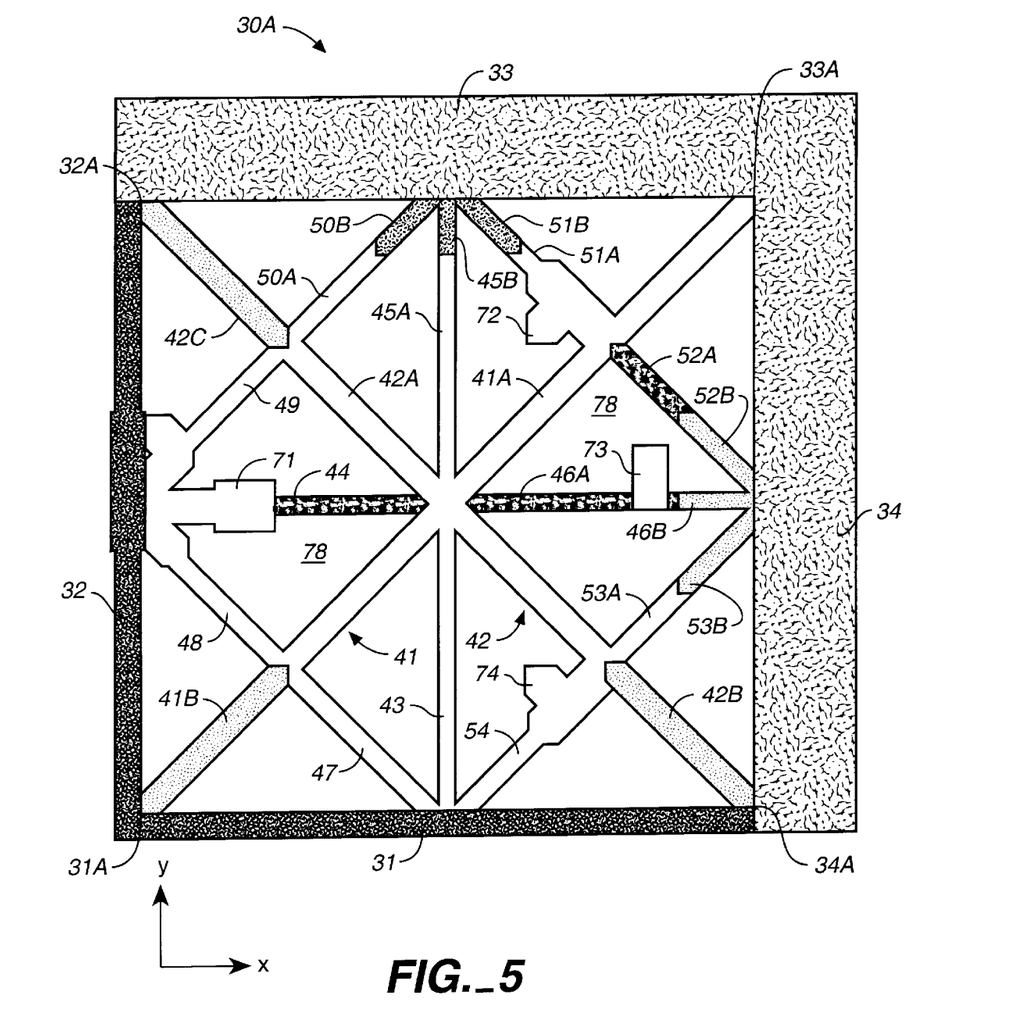

FIG. 5 illustrates another embodiment of a stage platen 30A which essentially has the same components as the stage platen of FIGS. 2 and 3 except that diagonal rib 42 comprises tri-rib segments 42A, 42B, and 42C. Segment 42C has a height of 2 in. (5.1 cm) and a thickness of 0.25 in. (0.64 cm). Furthermore, the ribs 50, 45, and 51 of the stage platen of FIG. 2 has now comprises bi-rib segments 50A and 50B, 45A and 45B, and 51A and 51B, respectively. Each of segments 50B, 45B, and 51B has a height of 1.535 in. (3.9 cm) and a thickness of 0.125 in. (0.32 cm). Finally, for ribs and rib segments 41A, 42A, 43, 44, 45A, 46A, 47, 48, 49, 50A, 51A, 52A, 53A, and 54 the height is 1.67 in. (4.2 cm). In the stage platen of FIG. 2, these components had a height of 1.75 in. (4.4 cm). The dimensions of the other components remained the same.

The fully loaded stage platen of FIG. 5 has a mass of 21.8 lb (9.9 kg), but finite element modal analysis indicated that the first natural frequency decreased to 770 Hz from 800 Hz for the stage platen of FIG. 2. This decrease in stiffness is primarily a result of the 1.75 in (4.45 cm) ribs being reduced to a height of 1.67 in (4.24 cm).

Modifications to the stage platen design of FIG. 5 were also evaluated. In the first variation, the thickness of the short diagonal ribs 45B, 50B, and 51B, and 46B, 52B, and 53B was increased from 0.125 in. (0.32 cm) to 0.1875 in. (0.48 cm). This results in a weight increase of 0.3 lb (0.14 kg) for the fully loaded stage platen; and analysis showed that the first and second modes of vibrations occur at 794 Hz (a 24 Hz increase) and 1047 Hz (a 14 Hz increase), respectively. In the second variation, the thickness of the same short diagonal ribs 45B, 50B, and 51B, and 46B, 52B, and 53B was increased from 0.125 in (0.32 cm) to 0.25 in (0.64 cm). This results in a weight increase of 0.6 lb (0.27 kg) for the fully loaded stage platen; and the analysis showed that the first and second modes of vibrations occur at 814 Hz (a 44 Hz increase) and 1057 Hz (a 24 Hz increase), respectively. Finally, in the third variation the thickness of the two main diagonal ribs 41 and 42 was increased from 0.25 in (0.64 cm). to 0.75 in (1.91 cm). This results in a weight increase of 0.6 lb (0.27 kg) for the fully loaded stage platen; and the analysis showed that the first and second modes of vibrations occur at 793 Hz (a 23 Hz increase) and at 1049 Hz (a 16 Hz increase), respectively.

FIGS. 6, 7, 8, and 9 illustrate four additional stage platen embodiments that were analyzed. The stage platens in FIGS. 6, 7, and 8 had ribs with thicknesses of 0.25 in. (0.64 cm) and the one in FIG. 9 had ribs with thicknesses of 0.125 in. (0.32 cm). Table 2 sets forth the results of finite element modal analyses. The weights indicated are for stage platens without the accessories.

TABLE 2

| Figure | Weight | | First mode vib. frequency (Hz) | Second mode vib. frequency (Hz) |
| --- | --- | --- | --- | --- |
| | lb | (kg) | | |
| 6 | 11.4 | (5.2) | 865 | 1705 |
| 7 | 13.6 | (6.2) | 865 | 1959 |
| 8 | 13.8 | (6.3) | 1157 | 1462 |
| 9 | 8.0 | (3.6) | 1081 | 1471 |

Figure 6:
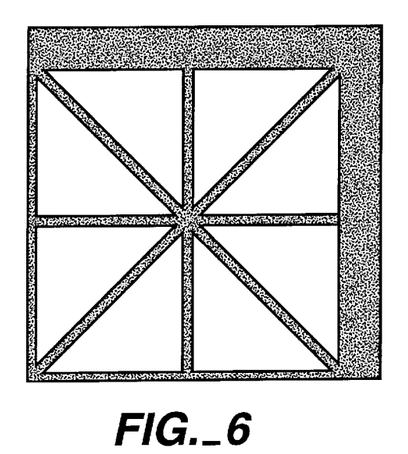
Figure 7:
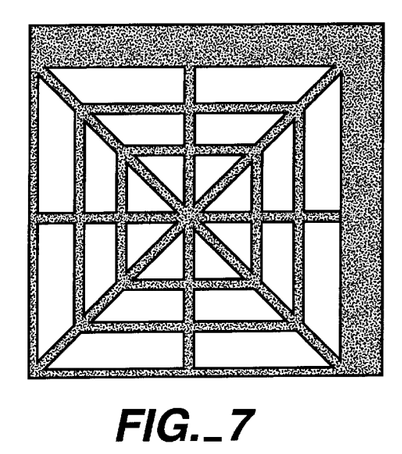

As is apparent, stage platens of FIGS. 6 and 7 had marginal stiffness and the mass of the stage platen was higher than desired, that is, greater than 10 lb (4.5 kg). The stage platen of FIG. 8 had good stiffness but the mass was too high. The configuration of FIG. 9 demonstrates the necessary high stiffness and low mass requirements.

Figure 8:
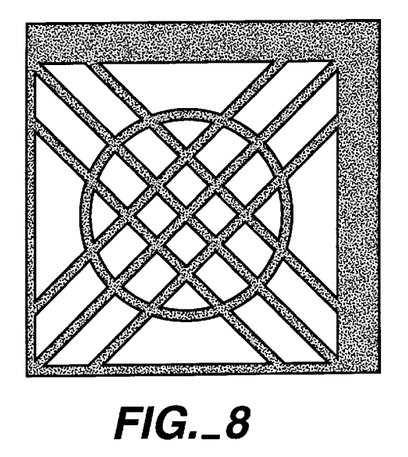
Figure 9:
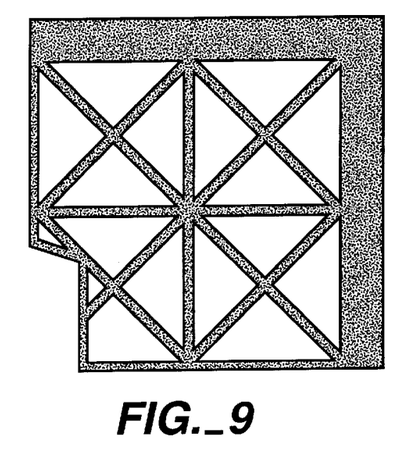

The first natural frequency for both stage platens 6 and 7 is 865 Hz. The additional horizontal ribs (i.e., parallel to the x axis) and vertical ribs (i.e., parallel to the y axis) in the design of FIG. 7 was found not to increase the first natural frequency, however, they did increase the second natural frequency which is already sufficiently high. In the configurations of FIGS. 8 and 9, the number of diagonal ribs was increased which greatly increased the frequency of the first mode. As is apparent, the stage platen of FIG. 9 is not rectangular although it does have orthogonal walls which can be polished to function as mirrors.

The stage platen of the present invention is particularly suited for use in an EUV lithography device for fabricating integrated devices that comprise at least one element having a dimension of $\leq 0.25$ $\mu$m. The fabrication process comprises construction of a plurality of successive levels by lithographic delineation using a mask pattern that is illuminated to produce a corresponding pattern image on the device being fabricated, ultimately to result in removal of or addition of material in the pattern image regions.

Referring to FIG. 1, where lithographic delineation is by projection, the collected radiation is preferably processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A stage platen, for supporting a chuck on an upper surface, the stage platen comprising:
   a frame that has interior walls that define an interior region and that has exterior walls wherein the outer surfaces of at least two adjacent exterior walls are reflective mirror surfaces wherein the frame has a rectangular interior contour with four corners and the matrix comprises (i) two main ribs each of which are attached to opposite corners of the frame and (ii) a plurality of diagonal ribs each of which is attached to adjacent interior walls of the interior surface; and
   a matrix of ribs within the interior region that are connected to the interior walls.

2. The stage platen of claim 1 wherein the stage platen exhibits a first vibrational mode at a frequency of greater than about 1000 Hz.

3. The stage platen of claim 1 wherein the frame and matrix of ribs form a unitary structure.

4. The stage platen of claim 1 wherein the frame and matrix of ribs are fabricated from a low thermal expansion material.

5. The stage platen of claim 4 wherein the low thermal expansion material has a thermal expansion coefficient of less than about 50 ppb/° C.

6. The stage platen of claim 4 wherein the low thermal expansion material is a glass ceramic.

7. The stage platen of claim 1 comprising a base floor which is integral with the frame and wherein the matrix of ribs is integral with the base and extends upwardly therefrom.

8. The stage platen of claim 1 wherein the stage platen has a mass of about 4.5 kg or less.

9. The stage platen of claim 2 wherein the first vibration mode is at a frequency of greater than 1100 Hz.

10. The stage platen of claim 1 wherein:
    (a) the frame has a substantially rectangular shape and has first, second, third, and fourth interior corners, with the first corner being opposite the third and the second corner being opposite the fourth;
    (b) the first and second corners delineate a first interior wall of the frame;
    (c) the second and third corners delineate a second interior of the frame;
    (d) the third and fourth corners delineate a third interior wall of the frame;
    (e) and the fourth and first corners delineate a fourth interior wall of the frame, and wherein (f) the stage platen comprises:
       (i) first and second main diagonal ribs, wherein the first main diagonal rib is connected to the first corner and the third corner, wherein the second main diagonal rib is connected to the second corner and the fourth corner and,
       (ii) a plurality of horizontal ribs, vertical ribs, and diagonal ribs that support the interior walls of the frame.

11. A stage platen, for supporting a chuck on an upper surface, the stage platen comprising:
    a frame that has interior walls that define an interior region and that has exterior walls wherein the outer surfaces of at least two adjacent exterior walls are reflective mirror surfaces; and
    a matrix of ribs within the interior region that are connected to the interior walls wherein the stage platen exhibits a first vibrational mode at a frequency of greater than about 1100 Hz.

12. The stage platen of claim 11 wherein the frame and matrix of ribs form a unitary structure.

13. The stage platen of claim 11 wherein the frame and matrix of ribs are fabricated from a low thermal expansion material.

14. The stage platen of claim 13 wherein the low thermal expansion material has a thermal expansion coefficient of less than about 50 ppb/° C.

15. The stage platen of claim 13 wherein the low thermal expansion material is a glass ceramic.

16. The stage platen of claim 11 comprising a base floor which is integral with the frame and wherein the matrix of ribs is integral with the base and extends upwardly therefrom.

17. The stage platen of claim 11 wherein the frame has a rectangular interior contour with four corners and the matrix comprises (i) two main ribs each of which are attached to opposite corners of the frame and (ii) a plurality of diagonal ribs each of which is attached to adjacent interior walls of the interior surface.

18. The stage platen of claim 11 wherein the stage platen has a mass of about 4.5 kg or less.

19. The stage platen of claim 11 wherein:
    (a) the frame has a substantially rectangular shape and has first, second, third, and fourth interior corners, with the first corner being opposite the third and the second corner being opposite the fourth;
    (b) the first and second corners delineate a first interior wall of the frame;
    (c) the second and third corners delineate a second interior of the frame;
    (d) the third and fourth corners delineate a third interior wall of the frame;
    (e) and the fourth and first corners delineate a fourth interior wall of the frame, and wherein (f) the stage platen comprises:
       (i) first and second main diagonal ribs, wherein the first main diagonal rib is connected to the first corner and the third corner, wherein the second main diagonal rib is connected to the second corner and the fourth corner and,
       (ii) a plurality of horizontal ribs, vertical ribs, and diagonal ribs that support the interior walls of the frame.

20. A stage platen assembly that comprises:
    (a) a stage platen that includes:
       (i) a frame that has a rectangular interior contour with four corners and that has interior walls that define an interior region and that has exterior walls wherein the outer surfaces of at least two exterior adjacent walls are reflective mirror surfaces; and
       (ii) a matrix comprises within the interior region that are connected to the interior walls wherein the matrix of ribs two main ribs each of which are attached to opposite corners of the frame and (ii) a plurality of diagonal ribs each of which is attached to adjacent interior walls of the interior surface;

(b) a chuck having an upper surface adapted to support a substrate wherein the chuck is attached to the matrix of ribs; and (c) actuators for moving the stage platen in vertical and horizontal directions wherein the actuators are attached to a lower surface of the stage platen.

21. The stage platen assembly of claim 20 wherein the stage platen assembly exhibits a first vibrational mode at a frequency of greater than about 800 Hz.

22. The stage platen assembly of claim 20 wherein the upper surface of the chuck is larger than 200 mm in diameter.

23. The stage platen assembly of claim 20 wherein the stage platen assembly has a mass of about 11.3 kg or less.

24. The stage platen assembly of claim 20 wherein the frame and matrix of ribs form a unitary structure.

25. The stage platen assembly of claim 20 wherein the frame and ribs is fabricated from a low thermal expansion material.

26. The stage platen assembly of claim 25 wherein the low thermal expansion material has a thermal expansion coefficient of less than about 50 ppb/° C.

27. The stage platen assembly of claim 25 wherein the low thermal expansion material is a glass ceramic.

28. The stage platen assembly of claim 20 wherein the stage platen comprises a base floor which is integral with the frame and wherein the matrix of ribs is integral with the base and extends upwardly therefrom.

29. The stage platen assembly of claim 20 wherein the stage platen has a mass of about 4.5 kg or less.

30. The stage platen assembly of claim 21 wherein the first vibration mode is at a frequency of greater than 800 Hz.

31. The stage platen assembly of claim 20 wherein:

(a) the frame has a substantially rectangular shape and has first, second, third, and fourth interior corners, with the first corner being opposite the third and the second corner being opposite the fourth;

(b) the first and second corners delineate a first interior wall of the frame;

(c) the second and third corners delineate a second interior of the frame;

(d) the third and fourth corners delineate a third interior wall of the frame; and (e) the fourth and first corners delineate a fourth interior wall of the frame, and wherein (f) the stage platen comprises:
  (i) first and second main diagonal ribs, wherein the first main diagonal rib is connected to the first corner and the third corner, wherein the second main diagonal rib is connected to the second corner and the fourth corner and
  (ii) a plurality of horizontal ribs, vertical ribs, and diagonal ribs that are connected to the interior walls of the frame.

32. A process for fabrication of a device comprising at least one element having a dimension $\leq 0.25$ $\mu$m, such process comprising construction of a plurality of successive levels, construction of each level comprising lithographic delineation, in accordance with which a subject mask pattern is illuminated to produce a corresponding pattern image on the device being fabricated, ultimately to result in removal of or addition of material in the pattern image regions, in which illumination used in fabrication of at least one level is extreme ultra-violet radiation, characterized in that the process employs a stage platen assembly that comprises:

(a) a stage platen that includes:
  (i) a frame that has a rectangular interior contour with four corners and that has interior walls that define an interior region and that has exterior walls wherein the outer surfaces of at least two exterior adjacent walls are reflective mirror surfaces; and
  (ii) a matrix of ribs within the interior region that are connected to the interior walls wherein the matrix comprises two main ribs each of which are attached to opposite corners of the frame and a plurality of diagonal ribs each of which is attached to adjacent interior walls of the interior surface;

(b) a chuck having an upper surface adapted to support a substrate wherein the chuck is attached to the matrix of ribs; and (c) actuators for moving the stage platen in vertical and horizontal directions wherein the actuators are attached to a lower surface of the stage platen.

33. The process of claim 32 wherein the stage platen assembly exhibits a first vibrational mode at a frequency of greater than about 800 Hz.

34. The process of claim 32 wherein the upper surface of the chuck is larger than 200 mm in diameter.

35. The process of claim 32 wherein the stage platen assembly has a mass of about 11.3 kg or less.

36. The process of claim 32 wherein the frame and matrix of ribs form a unitary structure.

37. The process of claim 32 wherein the frame and ribs is fabricated from a low thermal expansion material.

38. The process of claim 37 wherein the low thermal expansion material has a thermal expansion coefficient of less than about 50 ppb/° C.

39. The process of claim 37 wherein the low thermal expansion material is a glass ceramic.

40. The process of claim 32 wherein the stage platen comprises a base floor which is integral with the frame and wherein the matrix of ribs is integral with the base and extends upwardly therefrom.

41. The process of claim 32 wherein the stage platen has a mass of about 4.5 kg or less.

42. The process of claim 33 wherein the first vibration mode is at a frequency of greater than 800 Hz.

* * * * *